United States Patent
Ishibashi

(10) Patent No.: US 11,501,983 B2
(45) Date of Patent: Nov. 15, 2022

(54) SUBSTRATE CLEANING MEMBER AND SUBSTRATE CLEANING APPARATUS

(71) Applicant: EBARA CORPORATION, Tokyo (JP)

(72) Inventor: Tomoatsu Ishibashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 89 days.

(21) Appl. No.: 16/598,728

(22) Filed: Oct. 10, 2019

(65) Prior Publication Data

US 2020/0118843 A1 Apr. 16, 2020

(30) Foreign Application Priority Data

Oct. 12, 2018 (JP) .............................. JP2018-193312

(51) Int. Cl.
| | |
|---|---|
| H01L 21/67 | (2006.01) |
| B08B 1/00 | (2006.01) |
| B08B 1/02 | (2006.01) |
| B08B 1/04 | (2006.01) |

(52) U.S. Cl.
CPC ........ *H01L 21/67046* (2013.01); *B08B 1/006* (2013.01); *B08B 1/02* (2013.01); *B08B 1/04* (2013.01)

(58) Field of Classification Search
None
See application file for complete search history.

(56) References Cited

U.S. PATENT DOCUMENTS

| | | | |
|---|---|---|---|
| 5,375,291 | A | 12/1994 | Tateyama et al. |
| 5,937,469 | A | 8/1999 | Culkins et al. |
| 7,166,183 | B2 | 1/2007 | Nam et al. |
| 2004/0040576 | A1 | 3/2004 | Sun et al. |
| 2005/0000652 | A1 | 1/2005 | Nam et al. |
| 2008/0066780 | A1 | 3/2008 | Ueebisu |
| 2008/0276394 | A1 | 11/2008 | Sato |
| 2009/0050177 | A1 | 2/2009 | Nagayasu et al. |
| 2011/0209727 | A1 | 9/2011 | Wang et al. |
| 2020/0066549 | A1 | 2/2020 | Ishibashi |

FOREIGN PATENT DOCUMENTS

| | | |
|---|---|---|
| GB | 772599 A | 4/1957 |
| JP | H11-283952 A | 10/1999 |
| JP | 3933670 B2 | 6/2007 |
| JP | 2007-272236 A | 10/2007 |
| JP | 2011-181644 A | 9/2011 |

OTHER PUBLICATIONS

European Patent Application No. 19202831.4; Extended Search Report; dated Mar. 9, 2020; 12 pages.

*Primary Examiner* — Eric W Golightly

(74) *Attorney, Agent, or Firm* — BakerHostetler

(57) ABSTRACT

Provided is a substrate cleaning apparatus including: a substrate support mechanism configured to support a substrate; and a roll-type first cleaning member configured to clean a first surface of the substrate by rotating while being in contact with a bevel and/or an edge of the first surface of the substrate, wherein a rotation axis of the first cleaning member is in parallel with the substrate, and the first cleaning member has a large diameter portion and a small diameter portion.

19 Claims, 4 Drawing Sheets

[Fig.1]
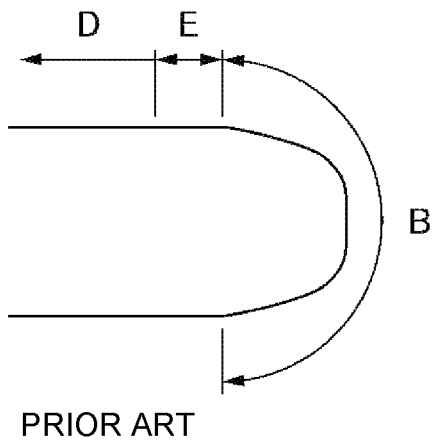
PRIOR ART
[Fig.2]
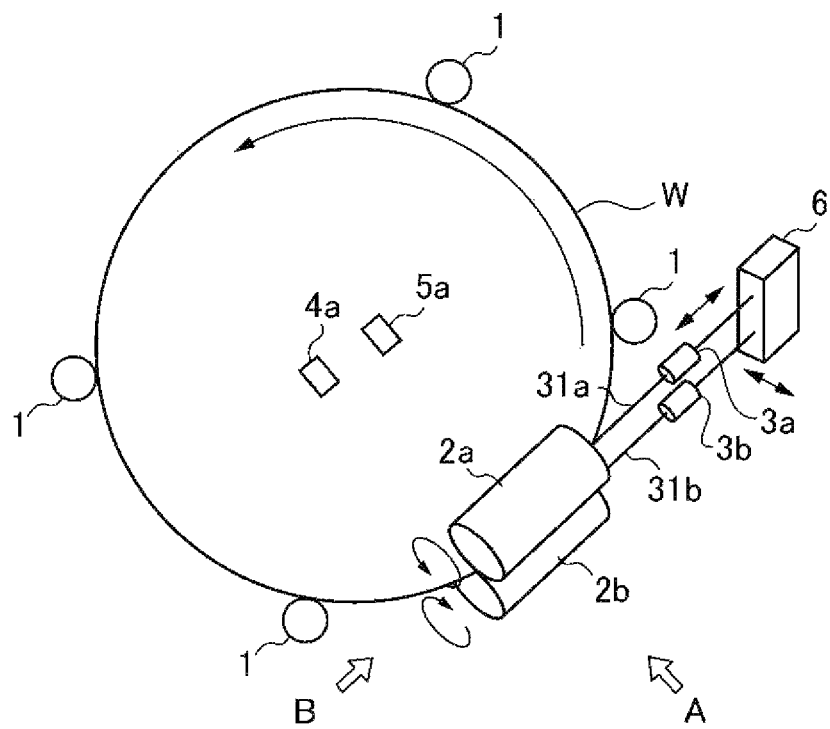
[Fig.3]
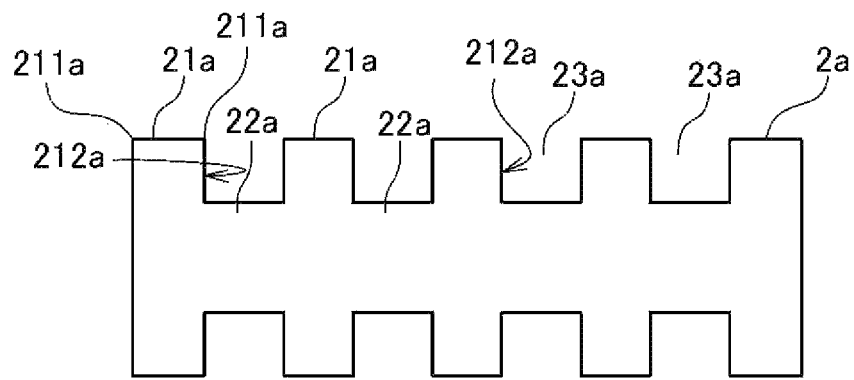

[Fig.4]
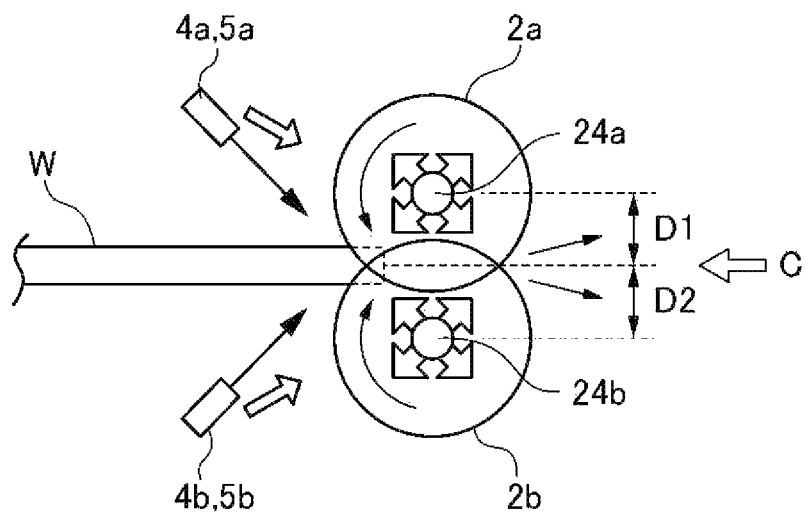
[Fig.5]
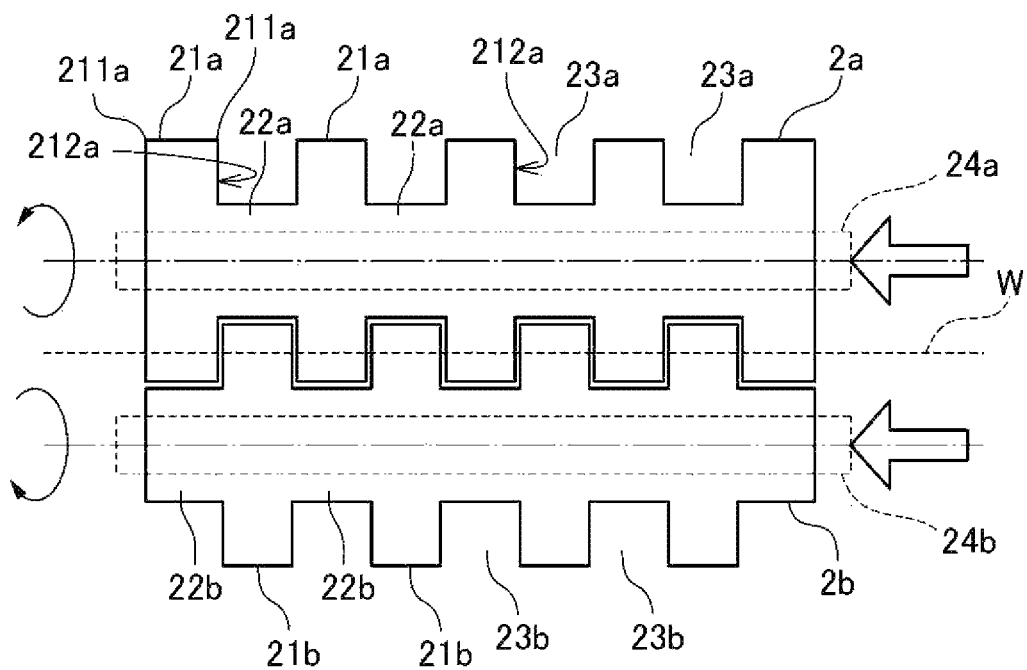

[Fig.6]
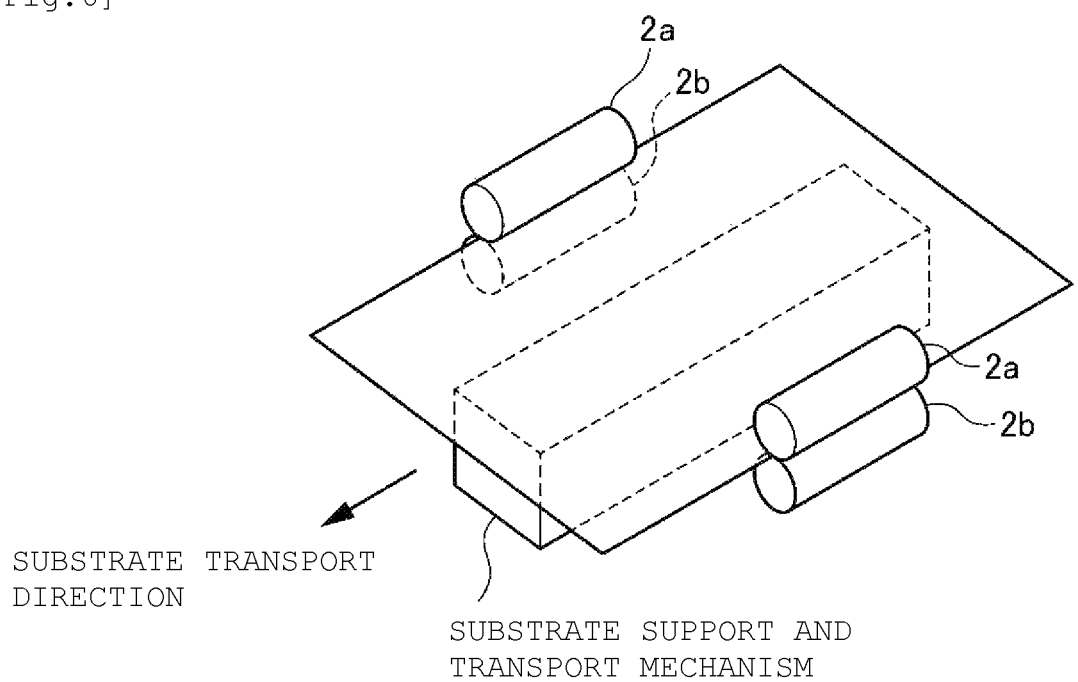

[Fig 7]
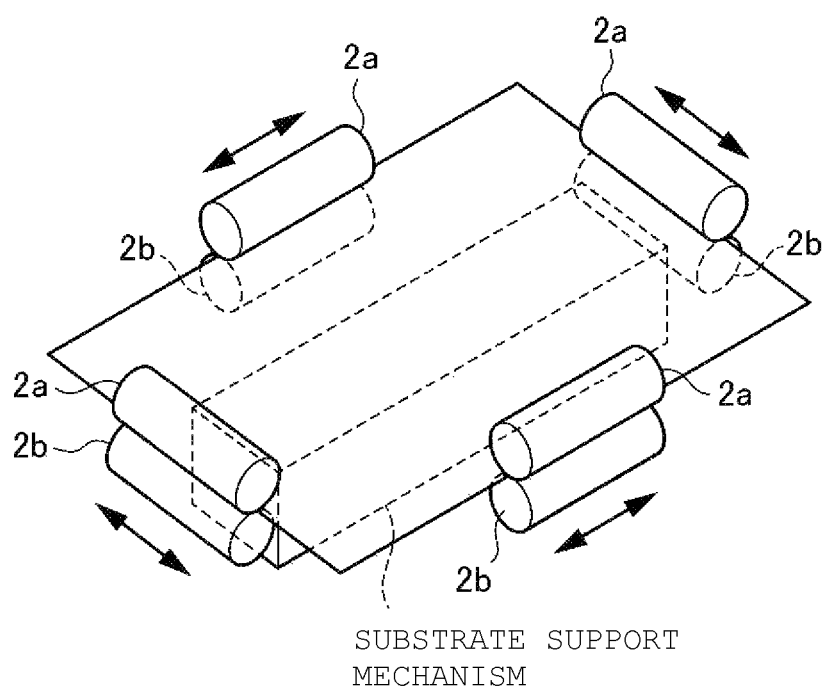
SUBSTRATE SUPPORT MECHANISM

SUBSTRATE CLEANING MEMBER AND SUBSTRATE CLEANING APPARATUS

CROSS REFERENCE TO RELATED APPLICATIONS

This application claims the benefit of Japanese Priority Patent Application JP 2018-193312 filed on Oct. 12, 2018, the entire contents of which are incorporated herein by reference.

FIELD

The present invention relates to a substrate cleaning member and a substrate cleaning apparatus.

BACKGROUND

Substrate cleaning apparatuses are disclosed in JP 3933670 B2 and U.S. Pat. No. 7,166,183. However, these substrate cleaning apparatuses do not necessarily have sufficient cleaning performance. Further, there is a case where cleaning processing is desired to be completed in a short time in order to perform cleaning within a limited amount of time from the viewpoint of throughput. However, there may be restrictions on performing cleaning efficiently for the reason that partial stains on a substrate are difficult to be cleaned depending on a type of the substrate, a process, and the like.

Furthermore, a request for improving removal performance of particles and the like near edge portions is more highlighted from further progress of miniaturization of substrate and a request for more efficiently utilizing an entire substrate including end portions as final end-products.

It is required to provide a substrate cleaning member and a substrate cleaning apparatus, which have high cleaning performance.

SUMMARY

According to one embodiment, provided is a substrate cleaning apparatus comprising: a substrate support mechanism configured to support a substrate; and a roll-type first cleaning member configured to clean a first surface of the substrate by rotating while being in contact with a bevel and/or an edge of the first surface of the substrate, wherein a rotation axis of the first cleaning member is in parallel with the substrate, and the first cleaning member comprises a large diameter portion and a small diameter portion.

Preferably, the substrate support mechanism is configured to hold the substrate and rotate the substrate.

Preferably, the substrate cleaning apparatus further comprising: a roll-type second cleaning member facing the first cleaning member and configured to clean a second surface of the substrate by rotating while being in contact with a bevel and/or an edge of the second surface of the substrate, wherein a rotation axis of the second cleaning member is in parallel with the substrate, the second cleaning member comprises a large diameter portion and a small diameter portion, and the small diameter portion of the second cleaning member is located facing the large diameter portion of the first cleaning member, the large diameter portion of the second cleaning member is located facing the small diameter portion of the first cleaning member, and the first cleaning member and the second cleaning member rotate without being in contact with each other.

Preferably, a rotation direction of the first cleaning member is a direction from a center of the substrate toward an edge of the substrate at a position where the first cleaning member is in contact with the substrate.

Preferably, the substrate cleaning apparatus further comprising: a first nozzle configured to supply liquid to the first surface of the substrate in a direction toward an edge of the substrate.

Preferably, the substrate cleaning apparatus further comprising: an actuator that swings the first cleaning member in a tangential direction, a radial direction, and/or a vertical direction of the substrate when the substrate is cleaned.

Preferably, the substrate has a polygonal shape, and the substrate support mechanism moves the substrate in a direction along a side of the substrate and the first cleaning member comes into contact with a bevel and/or an edge along a side of the substrate.

Preferably, the substrate has a polygonal shape, and the substrate cleaning apparatus further comprises a moving mechanism configured to move the first cleaning member in a direction along a side of the substrate.

According to another embodiment, provided is a substrate cleaning member configured to clean a substrate by rotating while being in contact with a bevel and/or an edge of the substrate and a rotation axis of the substrate cleaning member is in parallel with the substrate, the substrate cleaning member comprising: a large diameter portion and a small diameter portion.

Preferably, the substrate cleaning member further comprising: a plurality of large diameter portions.

According to another embodiment, a substrate cleaning member configured to clean a substrate, the substrate cleaning member comprising: a first cleaning member configured to clean a first surface of the substrate by rotating while being in contact with a bevel and/or an edge of the first surface of the substrate, the first cleaning member comprising a large diameter portion and a small diameter portion; and a second cleaning member facing the first cleaning member and configured to clean a second surface of the substrate by rotating while being in contact with a bevel and/or an edge of the second surface of the substrate, the second cleaning member comprising a large diameter portion and a small diameter portion, wherein rotation axes of the first cleaning member and the second cleaning member are in parallel with the substrate, and the small diameter portion of the second cleaning member is located facing the large diameter portion of the first cleaning member, the large diameter portion of the second cleaning member is located facing the small diameter portion of the first cleaning member, and the first cleaning member and the second cleaning member are configured to rotate without being in contact with each other.

BRIEF DESCRIPTION OF DRAWINGS

FIG. 1 is an explanation of a "bevel" and an "edge";

FIG. 2 is a top view schematically showing an overview configuration of a substrate cleaning apparatus according to an embodiment;

FIG. 3 is a front view of a roll type cleaning member;

FIG. 4 is a side view of the substrate cleaning apparatus;

FIG. 5 is an enlarged side view of a portion where a substrate and roll type cleaning members are in contact with each other;

FIG. 6 is a diagram showing a modified example of the substrate cleaning apparatus; and FIG. 7 is a diagram showing a modified example of the substrate cleaning apparatus.

DETAILED DESCRIPTION

Hereinafter, an embodiment according to the present invention will be specifically described with reference to the drawings.

A main object of the present embodiment is to clean a peripheral portion of a substrate (wafer) W. As the substrate W to be cleaned, not only a circular substrate, but also a rectangular substrate can be used. The substrate may also be a multi-layered substrate having a metal feature or may be a substrate in which various silicon oxide films having different film qualities are formed. The substrate is not limited to a semiconductor substrate, but includes arbitrary substrates such as a plasma display substrate, a liquid crystal display substrate, an organic EL display substrate, a photomask substrate, a magnetic disk substrate, and a magneto-optical disk substrate. Further, the shape of the substrate is not particularly limited, and is typically a circle, but may be a polygon such as a quadrangle. In the present specification, as shown in FIG. 1, in a substrate end portion, a portion B whose cross-section has a curvature is called a "bevel", and a region E closer to the bevel than a region D where a device is formed is called an "edge". The bevel and the edge are collectively called a "peripheral portion".

FIG. 2 is a top view schematically showing an overview configuration of a substrate cleaning apparatus according to an embodiment. The substrate cleaning apparatus includes spindles 1, roll type cleaning members 2a and 2b, motors 3a and 3b, cleaning liquid nozzles 4a and 4b, rinse liquid nozzles 5a and 5b, and an actuator 6 (the cleaning liquid nozzle 4b and the rinse liquid nozzle 5b do not appear in FIG. 2 because they are located below the substrate W).

The spindles 1 are an example of a substrate support mechanism and hold the peripheral portion of the substrate W with its surface facing up. Further, the spindles 1 in the present embodiment rotate the substrate W in a horizontal plane. More specifically, the substrate W is rotated by positioning the peripheral portion of the substrate W in a holding groove formed on an outer circumferential side surface of a piece provided in an upper portion of the spindle 1, inwardly pressing the peripheral portion of the substrate W, and rotating (auto-rotating) the piece. Here, the "piece" can be paraphrased to a "holding portion" for holding the substrate. The "spindle" can be paraphrased to a "roller".

The substrate W may be held and rotated by another method such as applying a spin chuck that sucks a lower surface of the substrate W and rotates the substrate W without using the spindles 1.

The roll type cleaning member 2a cleans an upper surface of the substrate W and the roll type cleaning member 2b cleans a lower surface of the substrate W. Typically, the upper surface of the substrate W is a device surface where a device pattern is formed and the lower surface of the substrate W is a non-device surface where the device pattern is not formed. The non-device surface can be paraphrased to a back surface.

More specifically, the roll type cleaning member 2a cleans the upper surface of the substrate W by rotating while being in contact with the peripheral portion of the upper surface of the substrate W. The roll type cleaning member 2b is arranged facing the roll type cleaning member 2a, that is, arranged below the roll type cleaning member 2a. The roll type cleaning member 2b cleans the lower surface of the substrate W by rotating while being in contact with the peripheral portion of the lower surface of the substrate W. Although it is desirable that the roll type cleaning members 2a and 2b are in contact with the peripheral portion of the substrate W (that is, both the edge and the bevel of the substrate W), the roll type cleaning members 2a and 2b may be in contact with only one of the edge and the bevel.

The roll type cleaning member 2a is connected to the motor 3a through a shaft 31a. The roll type cleaning member 2a is rotated by rotation of the motor 3a. A rotation direction of the roll type cleaning member 2a is a direction from the center to the edge of the substrate W (counterclockwise as seen from an arrow B) at a position where the roll type cleaning member 2a is in contact with the substrate W.

The roll type cleaning member 2a can be moved in a tangential direction (that is, a longitudinal (axis) direction of the roll type cleaning member 2a), a radial direction, and/or a vertical direction of the substrate W by the actuator 6. The roll type cleaning member 2a is moved (swung) in the tangential direction, the radial direction, and the vertical direction of the substrate W during cleaning, so that cleaning performance is improved. The moving (swinging) direction may be one of the tangential direction, the radial direction, and the vertical direction, or may be an arbitrary combination of two of the three directions. A position of the radial direction may be arbitrarily set by a recipe.

The roll type cleaning member 2a can be moved in the radial direction of the substrate W by the actuator 6. During standby in which cleaning of the substrate W is not performed, the roll type cleaning member 2a is located at a position away from the position where the substrate W is arranged in a direction perpendicular to an outer circumferential direction. This position is called a "retreat position". When the cleaning of the substrate W is performed, the roll type cleaning member 2a moves toward the center of the substrate W from the retreat position and comes into contact with the substrate W. This position is called a "cleaning position". When the cleaning is completed, the roll type cleaning member 2a moves in the direction perpendicular to the outer circumferential direction of the substrate W toward the retreat position.

While the roll type cleaning member 2a has been mainly described, the same goes for the roll type cleaning member 2b. The roll type cleaning members 2a and 2b may move integrally (or in synchronization with each other) in the radial direction of the substrate W or may move independently from each other. The roll type cleaning members 2a and 2b may move integrally (or in synchronization with each other) in the tangential direction of the substrate W. The roll type cleaning members 2a and 2b may be able to move in a vertical direction (a direction perpendicular to the substrate W).

The cleaning liquid nozzle 4a and the rinse liquid nozzle 5a are arranged above the substrate W. When the substrate W is cleaned, the cleaning liquid nozzle 4a supplies a cleaning liquid such as chemical liquid or pure water to the upper surface of the substrate W and the rinse liquid nozzle 5a supplies a rinse liquid such as pure water to the upper surface of the substrate W. It is desirable that a direction in which the cleaning liquid nozzle 4a and the rinse liquid nozzle 5a supply liquids (the cleaning liquid and the rinse liquid) is a direction from the center toward the outside of the substrate W. This is because to prevent a liquid, which is attached on the substrate W and contaminated, from staying on the substrate W for a long time.

The cleaning liquid nozzle 4b and the rinse liquid nozzle 5b are arranged below the substrate W and supply liquids to the lower surface of the substrate W when the substrate W is cleaned. The others are the same as those of the cleaning liquid nozzle 4a and the rinse liquid nozzle 5a.

In the substrate cleaning apparatus described above, in a state where the substrate W is rotated by the spindles 1, while the cleaning liquid nozzles 4a and 4b supply the cleaning liquid to the upper surface and the lower surface of the substrate W, respectively, the roll type cleaning members 2a and 2b come into contact with the upper surface and the lower surface of the substrate W, respectively, and rotate, so that the upper surface and the lower surface of the substrate W are physically cleaned in contact mode.

FIG. 3 is a front view of the roll type cleaning member 2a (a view seen from an arrow A of FIG. 2). As shown in FIG. 3, in the roll type cleaning member 2a, large diameter portions 21a and small diameter portions 22a are alternately stacked to form recesses and projections. The roll type cleaning member 2a can be considered to have a cylindrical shape where a plurality of grooves 23a is formed in a circumferential direction. Alternatively, it can be considered that recesses and projections are formed on the roll type cleaning member 2a in a longitudinal direction (axis direction). The groove 23a becomes a ring closed between surfaces perpendicular to a rotation axis of the roll type cleaning member 2a. Each groove 23a is separated from the adjacent grooves 23a by the large diameter portions 21a and becomes independent. Although FIG. 3 shows the large diameter portion 21a and the small diameter portion 22a as rectangles, the large diameter portion 21a may have a shape where a corner portion 211a that comes into contact with the substrate W when the substrate is cleaned is formed. For example, the large diameter portion 21a may have a trapezoidal shape. Although not shown in the drawings, the roll type cleaning member 2b also has a shape where the large diameter portions 21b and the small diameter portions 22b are alternately stacked.

FIG. 4 is a side view of the substrate cleaning apparatus (a view seen from an arrow B of FIG. 2). FIG. 5 is an enlarged side view of a portion where the substrate W and the roll type cleaning members 2a and 2b are in contact with each other (a view seen from an arrow C of FIG. 4). As shown in FIGS. 4 and 5, the peripheral portion of the substrate W is inserted between the roll type cleaning members 2a and 2b. Specifically, as shown in FIG. 5, the lengths in the longitudinal direction of the roll type cleaning members 2a and 2b are substantially the same. The large diameter portions 21a of the roll type cleaning member 2a and the large diameter portions 21b of the roll type cleaning member 2b are arranged alternately with each other. More specifically, the small diameter portion 22b of the roll type cleaning member 2b is located facing the large diameter portion 21a of the roll type cleaning member 2a, and the large diameter portion 21b of the roll type cleaning member 2b is located facing the small diameter portion 22a of the roll type cleaning member 2a. Thereby, the large diameter portion 21a of the roll type cleaning member 2a and the small diameter portion 22b of the roll type cleaning member 2b are engaged with each other, and the small diameter portion 22a of the roll type cleaning member 2a and the large diameter portion 21b of the roll type cleaning member 2b are engaged with each other, so that they are rotated without interfering with other (without coming into contact with each other).

By such a constitution, it is possible to suppress dust generation due to contact between the roll type cleaning members 2a and 2b. Further, also by a rotation action of the substrate W, a large number of corner portions 211a of the large diameter portions 21a and 21b of the roll type cleaning members 2a and 2b come into contact with the substrate W, so that particle removal performance is enhanced.

Specifically, in FIG. 3, there are five corner portions 211a in the roll type cleaning member 2a, so that the peripheral portion of the substrate W repeats contact and separation with respect to the corner portion 211a five times during one rotation of the substrate W. In a particle removal mechanism of the roll type cleaning member 2a, it is considered that a great effect is produced by a physical force generated when the corner portions 211a of the roll type cleaning member 2a come into contact with and wipe the substrate W, and further, a physical force can be periodically and repeatedly applied to particles, so that high particle removal performance can be obtained.

Here, the particle removal performance is improved by swinging the roll type cleaning members 2a and 2b. For example, the roll type cleaning members 2a and 2b may be slightly swung in the tangential direction and/or the radial direction of the substrate W by the actuator 6 described above.

When performing cleaning by supplying liquid, the cleaning liquid nozzles 4a and 4b and the rinse liquid nozzles 5a and 5b supply a cleaning liquid in a direction toward the edge of the substrate W. The roll type cleaning members 2a and 2b rotate so that rotation directions of the roll type cleaning members 2a and 2b at positions where the roll type cleaning members 2a and 2b are in contact with the substrate W are directions toward the edge of the substrate W. That is, the cleaning liquid is supplied in a direction where the liquid is flowed into the rotations of the roll type cleaning members 2a and 2b. Thereby, fresh liquid can be smoothly supplied between the substrate and the roll type cleaning members 2a and 2b. The liquid flows through the grooves 23a and 23b by using side surfaces 212a of the large diameter portions 21a and 21b of the roll type cleaning members 2a and 2b as walls, and the liquid is discharged in the direction perpendicular to the outer circumferential direction of the substrate W. The grooves 23a and 23b are independent from each other, so that the cleaning liquid contaminated by the cleaning does not flows into adjacent grooves 23a and 23b. Thereby, it is possible to supply sufficient cleaning liquid at contact portions between the substrate and the corner portions 211a, so that cleaning performance by the cleaning liquid is improved and particle discharge performance is also improved.

The cleaning liquid nozzles 4a and 4b and the rinse liquid nozzles 5a and 5b need not necessarily supply the liquid onto the substrate W, but may supply the liquid to a portion where the substrate W and the roll type cleaning members 2a and 2b are in contact with each other (cross each other) or a portion near the contact portion. Alternatively, the liquid may be supplied to two or more of a portion on the substrate W, the contact portion, and the portion near the contact portion. In any case, it is desirable that the cleaning liquid and the rinse liquid are supplied to the substrate W in a direction in which the liquids are discharged to the outside of the substrate W.

As shown in FIGS. 4 and 5, the roll type cleaning members 2a and 2b have cores 24a and 24b which are rotating mechanisms to be rotation axes and which extend in parallel with the substrate W. The liquid may be supplied to the insides of the cores 24a and 24b (so-called "inner rinse"). The supplied liquid is moved from the insides of the cores 24a and 24b to the surfaces (cleaning surfaces) of the roll type cleaning members 2a and 2b by centrifugal forces generated by the rotations of the roll type cleaning members 2a and 2b and supplied to the substrate W. The external supply of the liquid from the cleaning liquid nozzles 4a and 4b and the rinse liquid nozzles 5a and 5b may be combined with the inner rinse. The roll type cleaning members 2a and 2b may be combined with or integrated with the cores 24a and 24b in advance before the roll type cleaning members 2a and 2b are used in the substrate cleaning apparatus. Alternatively, the roll type cleaning members 2a and 2b may only have holes where the cores 24a and 24b will be inserted, and the roll type cleaning members 2a and 2b may be used by inserting the cores 24a and 24b included in the substrate cleaning apparatus into the holes.

In this way, in the present embodiment, the roll type cleaning members 2a and 2b have the large diameter portions 21a and 21b and the small diameter portions 22a and 22b. Therefore, the corner portions 211a of the large diameter portions 21a and 21b repeatedly come into contact with the substrate W and thereby physical cleaning performance is increased, and the cleaning liquid is held by the side surfaces 212a used as walls and thereby a cleaning effect by the cleaning liquid is increased and the cleaning performance is improved.

The centers of the cores 24a and 24b of the roll type cleaning members 2a and 2b are distant from the center in the thickness direction of the substrate W by distances D1 and D2, respectively. The distances D1 and D2 may be equal or different from each other. The distances D1 and D2 may be arbitrarily set by recipe. The roll type cleaning members 2a and 2b may be moved (swung) in the vertical direction so that the distances D1 and D2 vary during cleaning. A portion to be cleaned can be adjusted according to an adhesion situation of particles or the like.

Typically, a member made of PVA sponge is used as the roll type cleaning members 2a and 2b. However, to further improve the cleaning performance, the surfaces of the roll type cleaning members 2a and 2b may include fine abrasive grains, fluorine-based resin particles, catalyst particles, or the like. The cleaning may be performed by holding the substrate W in the vertical direction instead of the horizontal direction. The roll type cleaning members 2a and 2b need not necessarily be provided above and below the substrate W, but the substrate cleaning apparatus may include only the roll type cleaning member 2a that cleans the upper surface of the substrate W. In this case, the distance D1 may be 0. Alternatively, the substrate cleaning apparatus may include only the roll type cleaning member 2b that cleans the lower surface of the substrate W. In this case, the distance D2 may be 0.

Although the embodiment described above is targeted at a circular substrate, the roll type cleaning members 2a and 2b can be applied to cleaning of a polygonal (for example, rectangular) substrate. Specifically, as shown in FIG. 6, while a substrate support moving mechanism of the substrate support mechanism moves a rectangular substrate along one side in a horizontal posture, peripheral portions of the rectangular substrate may be cleaned by causing the roll type cleaning members 2a and 2b to come into contact with the substrate along a moving direction. Alternatively, as shown in FIG. 7, it is allowed that the substrate is fixed and the roll type cleaning members 2a and 2b are moved along the sides.

The above embodiment is described so that a person with an ordinary skill in the technical field to which the invention pertains can implement the invention. Various modified examples of the above embodiments can be naturally made by those skilled in the art, and the technical idea of the invention can be applied to other embodiments. Therefore, the invention is not limited to the described embodiment and should encompass the widest range in accordance with the technical ideas defined by the claims.

What is claimed is:
1. A substrate cleaning apparatus comprising:
   a substrate support mechanism configured to support a substrate;
   a roll-type first cleaning member configured to clean a first surface of the substrate by rotating while being in contact with a bevel and/or an edge of the first surface of the substrate; and
   a roll-type second cleaning member facing the first cleaning member and configured to clean a second surface of the substrate by rotating while being in contact with a bevel and/or an edge of the second surface of the substrate, wherein
   a rotation axis of the first cleaning member is in parallel with the substrate and perpendicular to a radian from a center of the substrate and tangent to a direction of rotation of the substrate to expel debris outwardly away from an outer edge of the substrate, and
   a rotation axis of the second cleaning member is in parallel with the substrate and perpendicular to a radian from the center of the substrate and tangent to a direction of rotation of the substrate to expel debris outwardly away from an outer edge of the substrate,
   the first cleaning member comprises a plurality of large diameter portions and a plurality of small diameter portions, the large diameter portions and the small diameter portions being alternately arranged along a longitudinal direction of the first cleaning member, forming a plurality of grooves in a circumferential direction, each groove being separated from adjacent grooves by the large diameter portions and becoming independent, each of the larger diameter portions being larger than each of the small diameter portions,
   the second cleaning member comprises a plurality of large diameter portions and a plurality of small diameter portions, the large diameter portions and the small diameter portions being alternately arranged along a longitudinal direction of the first cleaning member, forming a plurality of grooves in a circumferential direction, each groove being separated from adjacent grooves by the large diameter portions and becoming independent, each of the larger diameter portions being larger than each of the small diameter portions,
   the small diameter portion of the second cleaning member is located facing the large diameter portion of the first cleaning member, the large diameter portion of the second cleaning member is located facing the small diameter portion of the first cleaning member, and the first cleaning member and the second cleaning member rotate without being in contact with each other.

2. The substrate cleaning apparatus according to claim 1, wherein
   the substrate support mechanism is configured to hold the substrate and rotate the substrate.

3. The substrate cleaning apparatus according to claim 1, wherein
   a rotation direction of the first cleaning member is a direction from a center of the substrate toward an edge of the substrate at a position where the first cleaning member is in contact with the substrate.

4. The substrate cleaning apparatus according to claim 1, further comprising:
   a first nozzle configured to supply liquid to the first surface of the substrate in a direction toward an edge of the substrate.

5. The substrate cleaning apparatus according to claim 1, further comprising:
an actuator that swings the first cleaning member in a tangential direction, a radial direction, and/or a vertical direction of the substrate when the substrate is cleaned.

6. The substrate cleaning apparatus according to claim 1, wherein
the substrate has a polygonal shape, and
the substrate support mechanism moves the substrate in a direction along a side of the substrate and the first cleaning member comes into contact with a bevel and/or an edge along a side of the substrate.

7. The substrate cleaning apparatus according to claim 1, wherein the substrate has a polygonal shape, and
the substrate has a polygonal shape, and
the substrate cleaning apparatus further comprises a moving mechanism configured to move the first cleaning member in a direction along a side of the substrate.

8. A substrate cleaning member configured to clean a substrate by rotating while being in contact with a bevel and/or an edge of the substrate and a rotation axis of the substrate cleaning member is in parallel with the substrate and perpendicular to a radian from a center of the substrate and tangent to a direction of rotation of the substrate to expel debris outwardly away from an outer edge of the substrate, the substrate cleaning member comprising:
a plurality of large diameter portions and a plurality of small diameter portions, the large diameter portions and the small diameter portions being alternately arranged along a longitudinal direction of the substrate cleaning member, forming a plurality of grooves in a circumferential direction, each groove being separated from adjacent grooves by the large diameter portions and becoming independent, each of the larger diameter portions being larger than each of the small diameter portions.

9. A substrate cleaning member configured to clean a substrate, the substrate cleaning member comprising:
a first cleaning member configured to clean a first surface of the substrate by rotating while being in contact with a bevel and/or an edge of the first surface of the substrate, the first cleaning member comprising a plurality of large diameter portions and a plurality of small diameter portions, the large diameter portions and the small diameter portions being alternately arranged along with a longitudinal direction of the first cleaning member, thereby a plurality of grooves are formed in a circumference direction, each groove being separated from adjacent grooves by the large diameter portions and becoming independent, each of the larger diameter portions being larger than each of the small diameter portions; and
a second cleaning member facing the first cleaning member and configured to clean a second surface of the substrate by rotating while being in contact with a bevel and/or an edge of the second surface of the substrate, the second cleaning member comprising a plurality of large diameter portions and a plurality of small diameter portions, the large diameter portions and the small diameter portions being alternately arranged along with a longitudinal direction of the first cleaning member, thereby a plurality of grooves are formed in a circumference direction, each groove being separated from adjacent grooves by the large diameter portions and becoming independent, each of the larger diameter portions being larger than each of the small diameter portions, wherein
rotation axes of the first cleaning member and the second cleaning member are in parallel with the substrate and perpendicular to a radian from a center of the substrate and tangent to a direction of rotation of the substrate to expel debris outwardly away from an outer edge of the substrate, and
the small diameter portion of the second cleaning member is located facing the large diameter portion of the first cleaning member, the large diameter portion of the second cleaning member is located facing the small diameter portion of the first cleaning member, and the first cleaning member and the second cleaning member are configured to rotate without being in contact with each other.

10. The substrate cleaning apparatus as recited in claim 1 wherein the plurality of large diameter portions and the plurality of small diameter portions form a plurality of corners wherein the corners are arranged perpendicular to a direction of rotation of the substrate during cleaning of the substrate.

11. The substrate cleaning apparatus as recited in claim 1 wherein the plurality of large diameter portions and the plurality small diameter portions form a plurality of grooves that prevent cleaning liquid from flowing into adjacent grooves during cleaning of the substrate.

12. The substrate cleaning apparatus as recited in claim 11 wherein the cleaning liquid is discharged in a direction perpendicular and outside of an outer edge of the substrate.

13. The substrate cleaning apparatus as recited in claim 1 wherein the plurality of large diameter portions and the plurality of small diameter portions have a width that is substantially the same for each of the large diameter portions and the small diameter portions.

14. The substrate cleaning member as recited in claim 8 wherein the plurality of large diameter portions and the plurality of small diameter portions form a plurality of corners wherein the corners are arranged perpendicular to a direction of rotation of the substrate during cleaning of the substrate.

15. The substrate cleaning member as recited in claim 8 wherein the plurality of large diameter portions and the plurality of small diameter portions form a plurality of grooves that prevent cleaning liquid from flowing into adjacent grooves during cleaning of the substrate.

16. The substrate cleaning member as recited in claim 8 wherein the plurality of large diameter portions and the plurality of small diameter portions have a width that is substantially the same for each of the large diameter portions and the small diameter portions.

17. The substrate cleaning member as recited in claim 9 wherein the plurality of large diameter portions and the plurality of small diameter portions form a plurality of corners wherein the corners are arranged to be perpendicular to a direction of rotation of the substrate during cleaning of the substrate.

18. The substrate cleaning member as recited in claim 9 wherein the plurality of grooves are configured to prevent cleaning liquid from flowing into adjacent grooves during cleaning of the substrate.

19. The substrate cleaning member as recited in claim 9 wherein the plurality of large diameter portions and the plurality of small diameter portions have a width that is substantially the same for each of the large diameter portions and the small diameter portions.

* * * * *